United States Patent
Sano

(10) Patent No.: US 8,502,897 B2
(45) Date of Patent: Aug. 6, 2013

(54) SOLID-STATE IMAGING DEVICE HAVING A CELL STRUCTURE OF PARALLEL CIRCUITS EACH INCLUDING SERIES CONNECTED CHARGED COUPLED DEVICES

(75) Inventor: Fumiaki Sano, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 347 days.

(21) Appl. No.: 12/880,553

(22) Filed: Sep. 13, 2010

(65) Prior Publication Data
US 2011/0096217 A1 Apr. 28, 2011

(30) Foreign Application Priority Data

Oct. 26, 2009 (JP) .................. 2009-245846

(51) Int. Cl.
*H04N 3/14* (2006.01)
*H04N 5/335* (2011.01)
*H01L 27/00* (2006.01)

(52) U.S. Cl.
USPC .............. 348/301; 348/302; 250/208.1

(58) Field of Classification Search
USPC ............ 348/294, 301, 302, 308; 250/208.1
See application file for complete search history.

(56) References Cited

U.S. PATENT DOCUMENTS

| | | | |
|---|---|---|---|
| 6,940,059 B2 | 9/2005 | Mabuchi | |
| 7,564,016 B2 | 7/2009 | Mabuchi | |
| 7,638,804 B2 * | 12/2009 | Kido et al. | 257/59 |
| 7,714,917 B2 * | 5/2010 | McKee | 348/294 |
| 7,924,333 B2 * | 4/2011 | Yin et al. | 348/308 |
| 2004/0135064 A1 | 7/2004 | Mabuchi | |
| 2006/0007334 A1 | 1/2006 | Mabuchi | |
| 2009/0008686 A1 | 1/2009 | Maeda et al. | |
| 2009/0090845 A1 * | 4/2009 | Yin et al. | 250/208.1 |
| 2009/0173974 A1 * | 7/2009 | Shah et al. | 257/292 |
| 2009/0184349 A1 * | 7/2009 | Dungan | 257/292 |
| 2009/0309144 A1 * | 12/2009 | Park et al. | 257/292 |
| 2010/0002117 A1 * | 1/2010 | Iwane et al. | 348/308 |
| 2010/0097508 A1 * | 4/2010 | Yanagita et al. | 348/301 |

FOREIGN PATENT DOCUMENTS

| | | |
|---|---|---|
| CN | 1507743 A | 6/2004 |
| JP | 2007-115994 | 5/2007 |
| JP | 2008-227253 | 9/2008 |
| JP | 2008-294176 | 12/2008 |

OTHER PUBLICATIONS

Office Action issued Aug. 3, 2012 in Chinese Application No. 201010274495.9 (With English Translation).

* cited by examiner

*Primary Examiner* — Kelly L Jerabek

(74) *Attorney, Agent, or Firm* — Oblon, Spivak, McClelland, Maier & Neustadt, L.L.P.

(57) ABSTRACT

According to one embodiment, a cell includes 2N pixels configured to accumulate charges generated based on incident light, an amplifier transistor is formed for each the cell and amplifies, for each of the pixels, signals read out from the pixels to a floating diffusion, and charge coupled devices transfer the charges accumulated in the pixels to the floating diffusion.

16 Claims, 5 Drawing Sheets

INCIDENT LIGHT

SOLID-STATE IMAGING DEVICE HAVING A CELL STRUCTURE OF PARALLEL CIRCUITS EACH INCLUDING SERIES CONNECTED CHARGED COUPLED DEVICES

CROSS-REFERENCE TO RELATED APPLICATIONS

This application is based upon and claims the benefit of priority from the prior Japanese Patent Application No. 2009-245846, filed on Oct. 26, 2009; the entire contents of which are incorporated herein by reference.

FIELD

Embodiments described herein relate generally to a solid-state imaging device.

BACKGROUND

In a CMOS image sensor, a pixel area is reduced according to an increase in the number of pixels. When pixel size is reduced, the number of saturated electrons of the pixels cannot be sufficiently secured. Therefore, the pixel area is reduced and the number of saturated electrons of the pixels is increased by adopting a four-pixel one-cell structure to cause four pixels to share a reset transistor and an amplifier transistor.

For example, Japanese Patent Application Laid-Open No. 2008-227253 discloses a method of providing, on a front surface side of a semiconductor substrate, a plurality of photoelectric conversion elements formed in a two-dimensional array shape, CCD-type signal readout means for reading out detection signals of the photoelectric conversion elements, and MOS-type signal readout means for reading out detection signals of the photoelectric conversion elements in a back-illuminated solid-state imaging device.

DETAILED DESCRIPTION

In general, according to one embodiment, a solid-state imaging device includes a cell, an amplifier transistor, charge coupled devices, horizontal driving lines, and a vertical signal line. The cell includes 2N pixels configured to accumulate charges generated based on incident light. The amplifier transistor is formed in each the cell and amplifies, for each of the pixels, signals read out from the pixels to a floating diffusion. The charge coupled devices transfer the charges accumulated in the pixels to the floating diffusion. The horizontal driving lines drive the charge coupled devices. The vertical signal line transmits the signals amplified by the amplifier transistor.

Exemplary embodiments of a solid-state imaging device will be explained below in detail with reference to the accompanying drawings. The present invention is not limited to the following embodiments.

Figure 1:
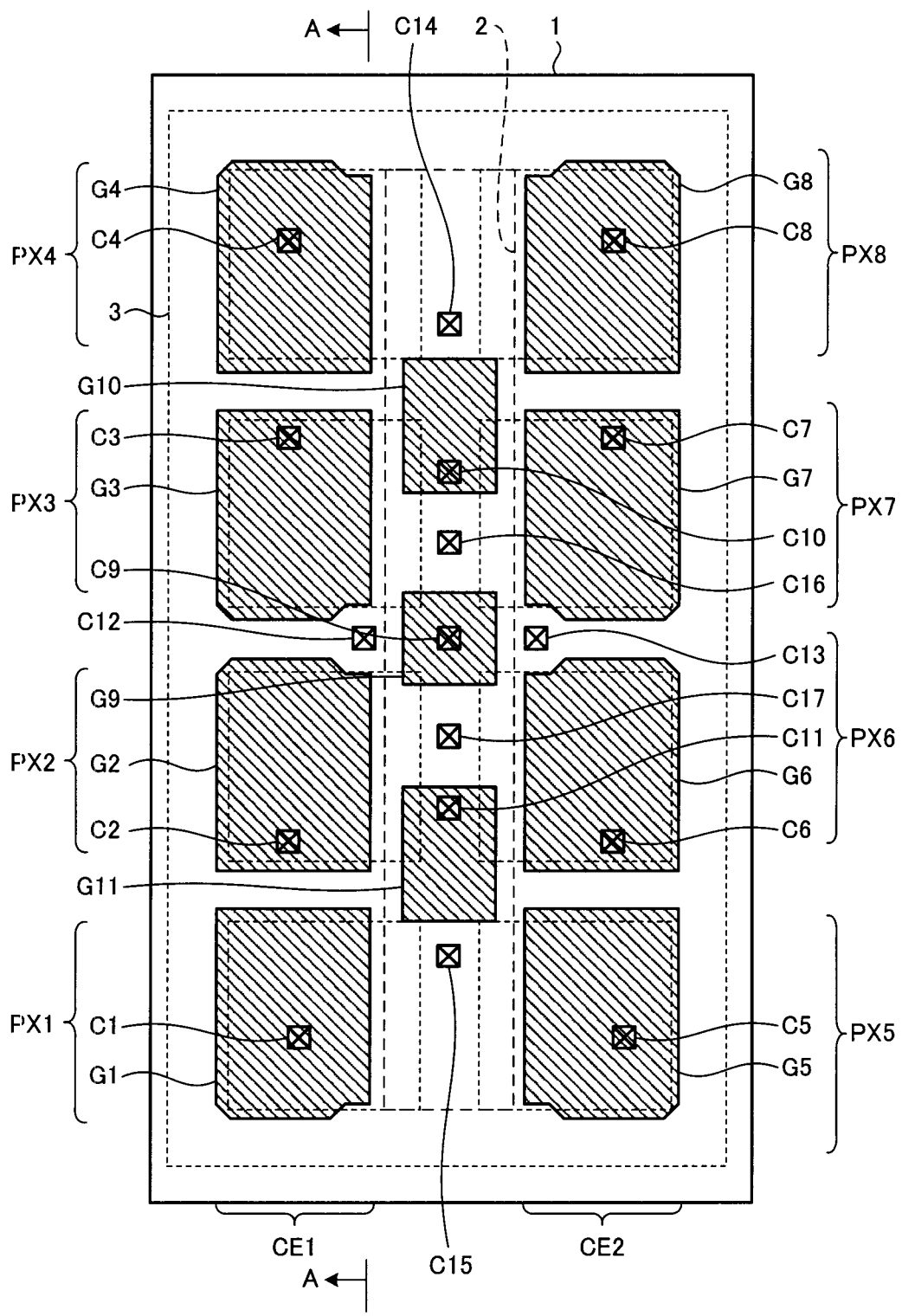
FIG. 1 is a plan view of a layout configuration of a solid-state imaging device according to a first embodiment of the present invention.
Figure 2:
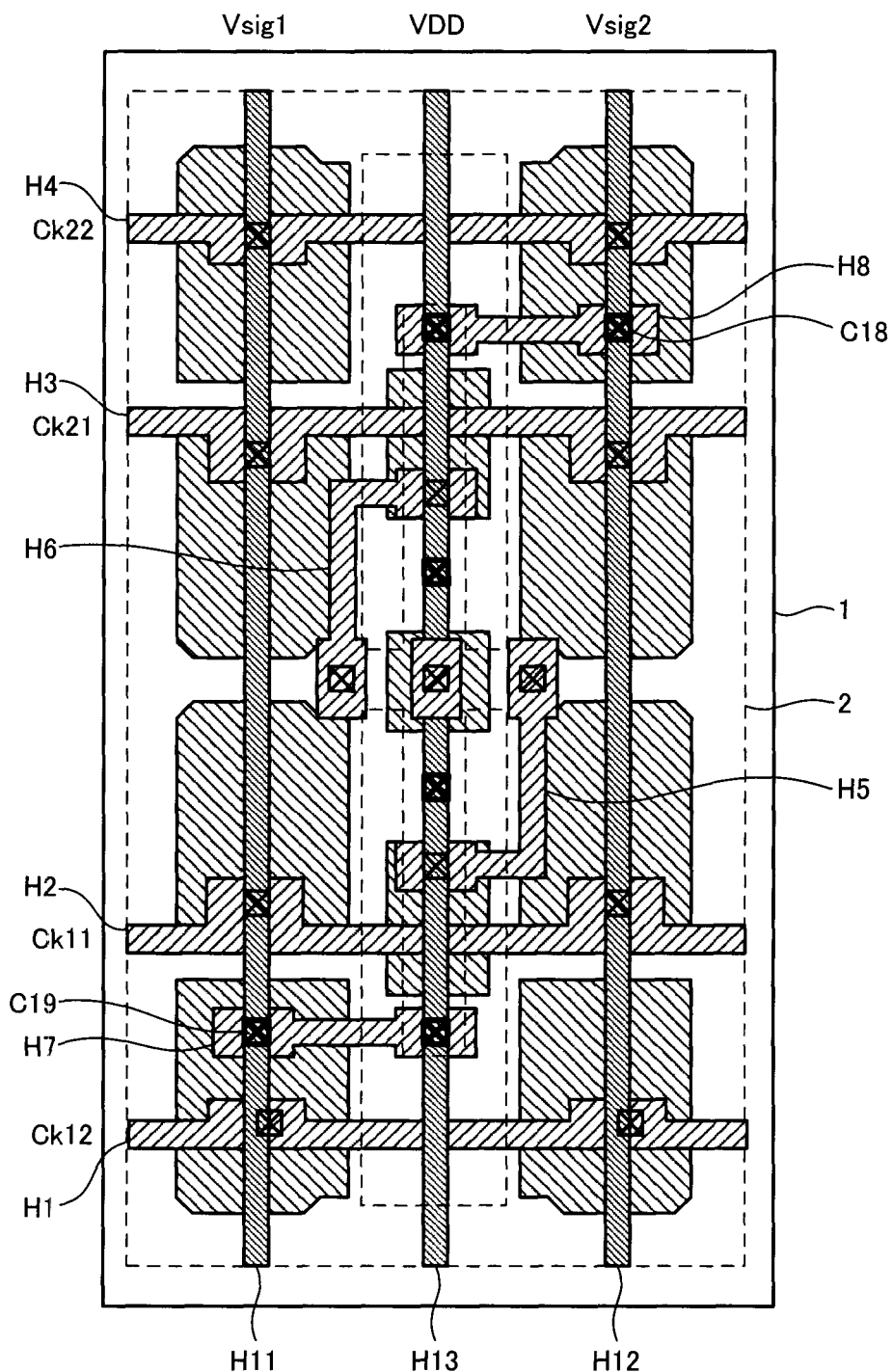
FIG. 2 is a plan view of the layout configuration of the solid-state imaging device according to the first embodiment of the present invention.
Figure 3:
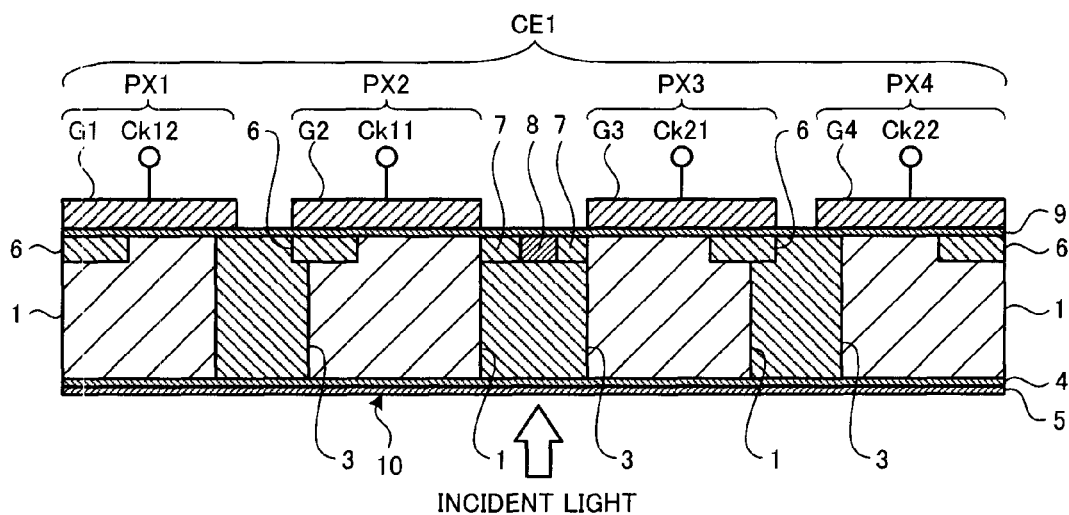
FIG. 3 is a sectional view of a configuration taken along line A-A shown in FIG. 1.

FIGS. 1 and 2 are plan views of a layout configuration of a solid-state imaging device according to a first embodiment of the present invention. FIG. 3 is a sectional view of a configuration taken along line A-A shown in FIG. 1. In FIGS. 1 and 2, four-pixel one-cell structures for two cells are shown. In FIG. 1, a positional relation between charge transfer electrodes G1 to G8 and gate electrodes G9 to G11 and a pixel separation diffusion layer 3 is shown. In FIG. 2, a positional relation between the charge transfer electrodes G1 to G8 and gate electrodes G9 to G11 and wires H1 to H8 and H11 to H13 is shown.

In FIGS. 1 to 3, an N$^-$ diffusion layer 4 and a P$^+$ diffusion layer 5 are sequentially laminated and a light receiving surface 10 is formed on the rear surface side of an N-type semiconductor substrate 1. On the front surface side of the N-type semiconductor substrate, a device isolation insulating layer 2 that isolates the N-type semiconductor substrate 1 is formed. A pixel isolation diffusion layer 3 that isolates the N-type semiconductor substrate 1 for each of pixels PX1 to PX8 is also formed. A material of the N-type semiconductor substrate 1 can be selected out of, for example, Si, Ge, SiGe, GaAs, InP, GaP, GaN, SiC, and GaInAsP. The device isolation layer 2 can have a local oxidation of silicon (LOCOS) structure or can have a shallow trench isolation (STI) structure. The pixel isolation diffusion layer 3 can include a P-type diffusion layer. A cell CE1 includes four pixels PX1 to PX4. A cell CE2 includes four pixels PX5 to PX8.

The charge transfer electrodes G1 to G8 are arranged respectively for the pixels PX1 to PX8 on the N-type semiconductor substrate 1 via a gate insulating film 9 to form charge coupled devices. The pixels PX1 to PX4 of the cell CE1 can be arranged side by side in the vertical direction. The pixels PX5 to PX8 of the cell CE2 can be arranged side by side in the vertical direction. The cells CE1 and CE2 can be arranged adjacent to each other in the horizontal direction.

A floating diffusion 8 is formed for each of the cells CE1 and CE2 on the front surface side of the N-type semiconductor substrate 1. The floating diffusion 8 can include an N$^+$ diffusion layer surrounded by a P$^-$ diffusion layer 7. In the cell CE1, the floating diffusion 8 can be arranged between the pixels PX2 and PX3. In the cell CE2, the floating diffusion 8 can be arranged between the pixels PX6 and PX7. The floating diffusion 8 of the cell CE1 can be arranged adjacent to the charge transfer electrodes G2 and G3. The floating diffusion 8 of the cell CE2 can be arranged adjacent to the charge transfer electrodes G6 and G7. On the front surface side on the N-type semiconductor substrate 1, P$^-$ diffusion layers 6 that give potential gradient to the floating diffusion 8 are formed on sides away from the floating diffusion 8 below the charge transfer electrodes G1 to G8.

On the front surface side on the N-type semiconductor substrate 1, the gate electrodes G10 and G11 are formed respectively for the cells CE1 and CE2 and the gate electrode G9 is formed common to the two cells CE1 and CE2. On the front and back and the left and right of the gate electrode G9, the gate electrodes G10 and G11 and the floating diffusions 8 of the cells CE1 and CE2 can be respectively arranged. The floating diffusions 8 of the cells CE1 and CE2 can be arranged adjacent to the gate electrode G9. The gate electrode G10 can be included in an amplifier transistor that amplifies signals read out from the pixels of the cell CE1 to the floating diffusion 8. The gate electrode G11 can be included in an amplifier transistor that amplifies signals read out from the pixels of the cell CE2 to the floating diffusion 8. The gate electrode 9 can be included in a reset transistor that resets charges accumulated in the pixels of the cells CE1 and CE2. Source layers are formed on one sides of the gate electrodes G10 and G11. Drain layers are formed between the gate electrodes G10 and G11 and the gate electrode G9.

On the front surface side on the N-type semiconductor substrate 1, the wires H1 to H4 that drive the charge transfer electrodes G1 to G8 are formed in the horizontal direction and the wires H11 and H12 that respectively transmit signals Vsig1 and Vsig2 respectively amplified by the amplifier transistors of the cells CE2 and CE1 are formed in the vertical direction. The wire H1 can drive the charge transfer electrodes G1 and G5, the wire H2 can drive the charge transfer electrodes G2 and G6, the wire H3 can drive the charge transfer electrodes G3 and G7, and the wire H4 can drive the charge transfer electrodes G4 and G8. The wire H13 that supplies power supply potential VDD is formed between the wires H11 and H12, whereby a power supply line is arranged in parallel to the vertical signal lines.

Further, on the front surface side on the N-type semiconductor substrate 1, the wire H5 that connects the floating diffusion 8 of the cell CE2 and the gate electrode G11 is formed, the wire H6 that connects the floating diffusion 8 of the cell CE1 and the gate electrode G10 is formed, the wire H7 that connects the source layer of the amplifier transistor of the cell CE2 and the wire H11 is formed, and the wire H8 that connects the source layer of the amplifier transistor of the cell CE1 and the wire H12 is formed.

Contacts C1 to C8 are respectively formed in the charge transfer electrodes G1 to G8. Contacts C9 to C11 are respectively formed in the gate electrodes G9 to G11. Contacts C12 and C13 are respectively formed in the floating diffusions 8 of the cells CE1 and CE2. Contacts C14 and C15 are respectively formed in the source layers on the one sides of the gate electrodes G10 and G11. A contact C16 is formed in the drain layer between the gate electrodes G9 and G10. A contact C17 is formed in the drain layer between the gate electrodes G9 and G11. A contact C19 is formed on the wire H7. A contact C18 is formed on the wire H8.

The charge transfer electrodes G1 and G5 are connected to the wire H1 respectively via the contacts C1 and C5. The charge transfer electrodes G2 and G6 are connected to the wire H2 respectively via the contacts C2 and C6. The charge transfer electrodes G3 and G7 are connected to the wire H3 respectively via the contacts C3 and C7. The charge transfer electrodes G4 and G8 are connected to the wire H4 respectively via the contacts C4 and C8. The floating diffusion 8 of the cell CE2 and the gate electrode G11 are connected to the wire H5 respectively via the contacts C13 and C11. The floating diffusion 8 of the cell CE1 and the gate electrode G10 are connected to the wire H6 respectively via the contacts C12 and 010. The source layer of the amplifier transistor of the cell CE2 and the wire H11 are connected to the wire H7 respectively via the contacts C15 and C19. The source layer of the amplifier transistor of the cell CE1 and the wire H12 are connected to the wire H8 respectively via the contacts C14 and C18. The gate electrode G9 can be connected to a reset line via the contact C9.

The wires H1 to H8 and the wires H11 to H13 can be formed in layers different from each other. For example, the wires H1 to H8 can be formed in a first wiring layer and the wires H11 to H13 can be formed in a second wiring layer.

Figure 4:
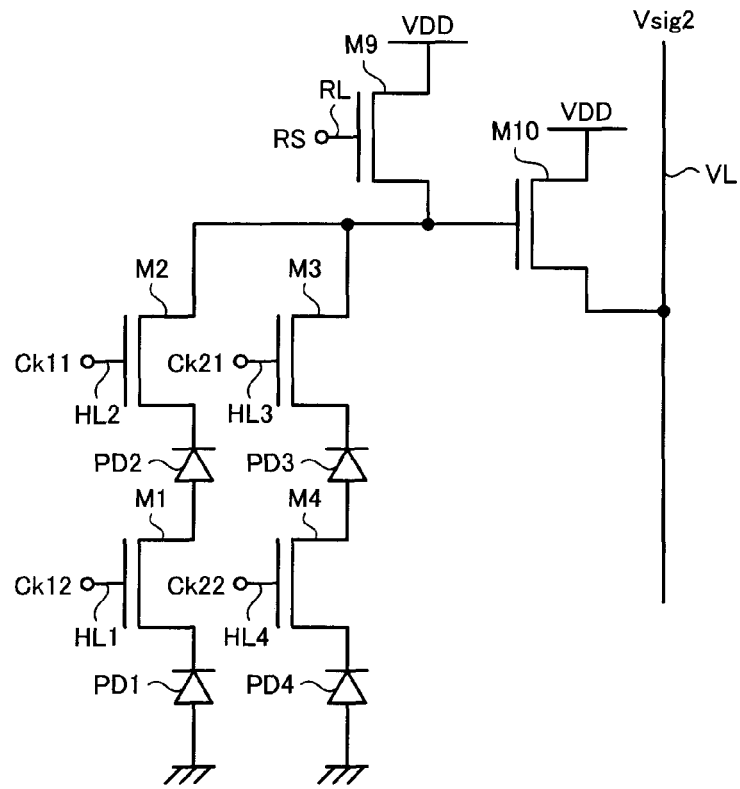
FIG. 4 is a diagram of an equivalent circuit for four pixels and one cell of the solid-state imaging device according to the first embodiment of the present invention.

FIG. 4 is a diagram of an equivalent circuit for four pixels and one cell of the solid-state imaging device according to the first embodiment of the present invention.

In FIG. 4, photodiodes PD1 to PD4 are respectively connected to charge coupled devices M1 to M4. The charge coupled devices M1 and M2 are connected in series to each other and the charge coupled devices M3 and M4 are connected in series to each other. A source of a reset transistor M9 and a gate of an amplifier transistor M10 are connected to the charge coupled devices M2 and M3. A gate of the reset transistor M9 is connected to a reset line RL. A source of the amplifier transistor M10 is connected to a vertical signal line VL. A drain of the reset transistor M9 and a drain of the amplifier transistor M10 are connected to the power supply potential VDD. The charge coupled devices M1 to M4 are respectively connected to horizontal driving lines HL1 to HL4.

The charge coupled devices M1 to M4 can respectively include the charge transfer electrodes G1 to G4 shown in FIG. 1. The pixels PX1 to PX4 shown in FIG. 1 can respectively include the photodiodes PD1 to PD4. The reset transistor M9 can include the gate electrode G9 shown in FIG. 1. The amplifier transistor M10 can include the gate electrode G10 shown in FIG. 1. A connection point of the source of the reset transistor M9, the gate of the amplifier transistor M10, and the charge coupled devices M2 and M3 can include the floating diffusion 8 shown in FIG. 3. The vertical signal line VL can include the wire H11. The horizontal driving lines HL1 to HL4 can include the wires H1 to H4.

FIGS. 5A to 5E are potential diagrams for explaining a method of reading out signals for four pixels and one cell of the solid-state imaging device according to the first embodiment of the present invention.

Figure 5A:
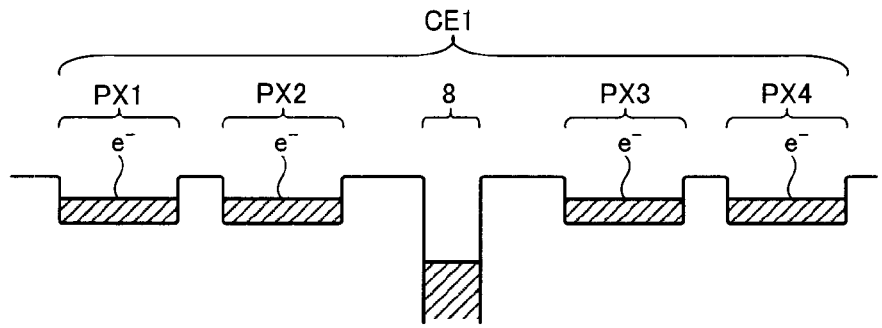
FIGS. 5A to 5E are potential diagrams for explaining a method of reading out signals for four pixels and one cell of the solid-state imaging device according to the first embodiment of the present invention.

In FIGS. 5A to 5E, driving signals Ck12, Ck11, Ck21, and Ck22 are respectively applied to the charge transfer electrodes G1 to G4 shown in FIG. 3 via the horizontal driving lines HL1 to HL4 shown in FIG. 4. As shown in FIG. 5A, when the driving signals Ck12, Ck11, Ck21, and Ck22 are off, charges e⁻ are separately accumulated in the pixels PX1 to PX4 based on incident light received via the light receiving surface 10.

Figure 5B:
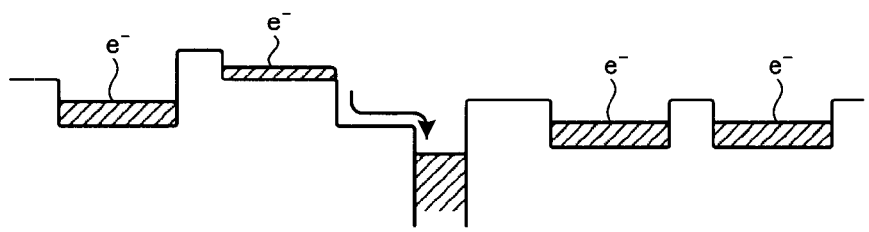

Subsequently, as shown in FIG. 5B, when the driving signal Ck11 is turned on, the potential of the pixel PX2 is raised and the charges accumulated in the pixel PX2 are transferred to the floating diffusion 8. When the charges accumulated in the pixel PX2 is transferred to the floating diffusion 8, the potential of the floating diffusion 8 changes. The potential is applied to the gate electrode G10. When the potential of the floating diffusion 8 is applied to the gate electrode G10 shown in FIG. 1, the signal Vsig2 corresponding to the charges accumulated in the pixel PX2 is amplified by the amplifier transistor M10 shown in FIG. 4 and read out to the vertical signal line VL.

Figure 5C:
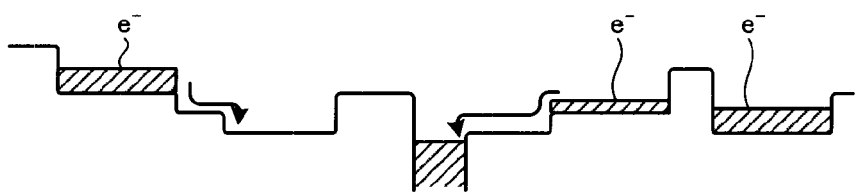

As shown in FIG. 5C, when the signal Vsig2 is read out from the pixel PX2, the driving signal Ck11 is turned off and the driving signals Ck12 and Ck21 are turned on. Then, the potential of the pixel PX2 is returned to the potential before being raised and the potentials of the pixels PX1 and PX3 are raised. The charges accumulated in the pixel PX3 are transferred to the floating diffusion 8 and the charges accumulated in the pixel PX1 are transferred to the pixel PX2.

When the charges accumulated in the pixel PX3 are transferred to the floating diffusion 8, the potential of the floating diffusion 8 changes. The potential is applied to the gate electrode G10. When the potential of the floating diffusion 8 is applied to the gate electrode G10 shown in FIG. 1, the signal Vsig2 corresponding to the charges accumulated in the pixel PX3 is amplified by the amplifier transistor M10 shown in FIG. 4 and read out to the vertical signal line VL.

Figure 5D:
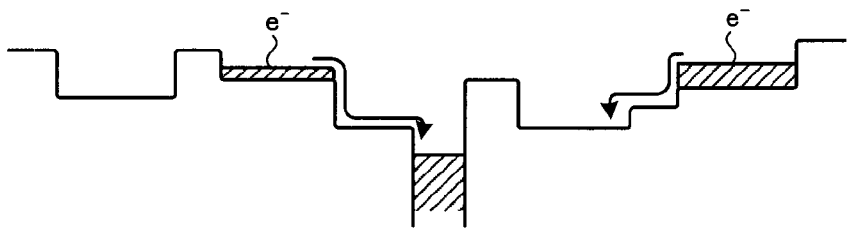

As shown in FIG. 5D, when the signal Vsig2 is read out from the pixel PX3, the driving signals Ck12 and Ck21 are turned off and the driving signals Ck11 and Ck22 are turned on. Then, the potentials of the pixels PX1 and PX3 are returned to the potentials before being raised and the potentials of the pixels PX2 and PX4 are raised. The charges transferred from the pixel PX1 to the pixel PX2 are transferred to the floating diffusion 8. The charges accumulated in the pixel PX4 are transferred to the pixel PX3.

When the charges transferred from the pixel PX1 to the pixel PX2 are transferred to the floating diffusion 8, the potential of the floating diffusion 8 changes. The potential is applied to the gate electrode G10. When the potential of the floating diffusion 8 is applied to the gate electrode G10 shown in FIG. 1, the signal Vsig2 corresponding to the charges accumulated in the pixel PX1 is amplified by the amplifier transistor M10 shown in FIG. 4 and read out to the vertical signal line VL.

Figure 5E:
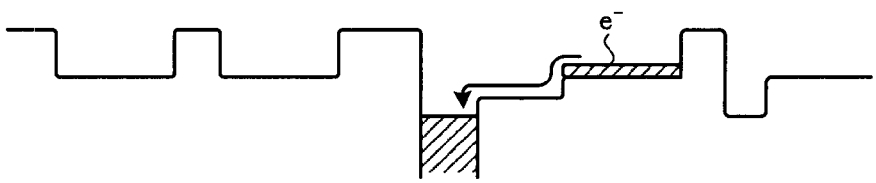

As shown in FIG. 5E, when the signal Vsig2 is read out from the pixel PX1, the driving signals Ck11 and Ck22 are turned off and the driving signal Ck21 is turned on. Then, the potentials of the pixels PX1 and PX4 are returned to the potentials before being raised and the potential of the pixel PX3 is raised. The charges transferred from the pixel PX4 to the pixel PX3 are transferred to the floating diffusion 8.

When the charges accumulated in the pixel PX4 are transferred to the floating diffusion 8, the potential of the floating diffusion 8 changes. The potential is applied to the gate electrode G10. When the potential of the floating diffusion 8 is applied to the gate electrode G10 shown in FIG. 1, the signal Vsig2 corresponding to the charges accumulated in the pixel PX4 is amplified by the amplifier transistor M10 shown in FIG. 4 and read out to the vertical signal line VL.

Concerning the pixels PX5 to PX8 of the cell CE2, a potential distribution is controlled in the same manner as the potential distribution control for the pixels PX1 to PX4 of the cell CE1. The signal Vsig1 is read out from the cell CE2 in parallel to the signal Vsig2 read out from the cell CE1.

Consequently, even when the four-pixel one-cell structure is adopted, signals can be read out from the pixels PX1 to PX8 in a readout time equal to a readout time in a one-pixel one-cell structure and a two-pixel one-cell structure. Therefore, it is possible to cause, without involving an increase in the readout time, four or more pixels to share the reset transistor M9 and the amplifier transistor M10 and it is possible to reduce pixel size.

Figure 6:
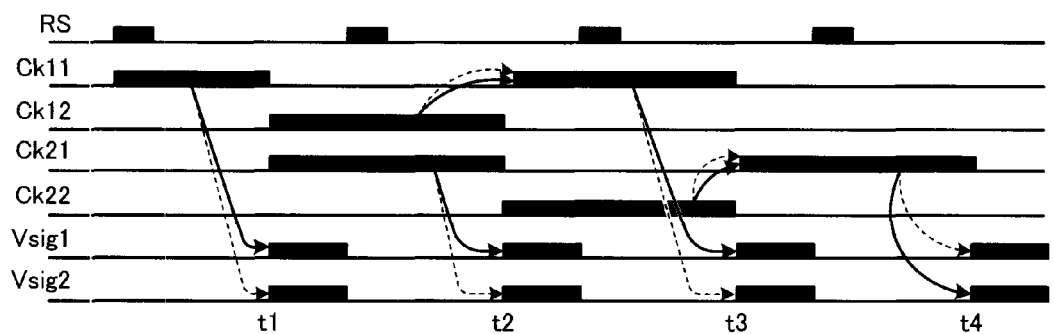
FIG. 6 is a timing chart for explaining a method of reading out signals of the solid-state imaging device according to the first embodiment of the present invention.

FIG. 6 is a timing chart for explaining a method of reading out a signal of the solid-state imaging device according to the first embodiment of the present invention.

In FIG. 6, when a reset signal RS is turned on, the reset transistor M9 shown in FIG. 4 is turned on and charges of the floating diffusions 8 of the cells CE1 and CE2 are reset. When the driving signal Ck11 is turned on, charges accumulated in the pixels PX2 and PX6 are respectively transferred to the floating diffusions 8 of the cells CE1 and CE2 and respectively read out as the signals Vsig2 and Vsig1 (time t1).

When the charges accumulated in the pixels PX2 and PX6 are read out, the reset signal RS is turned on. Then, the reset transistor M9 is turned on and the charges of the floating diffusions 8 of the cells CE1 and CE2 are reset.

When the charges accumulated in the pixels PX2 and PX6 are read out, the driving signal Ck21 is turned on. Then, charges accumulated in the pixels PX3 and PX7 are respectively transferred to the floating diffusions 8 of the cells CE1 and CE2 and respectively read out as the signals Vsig2 and Vsig1 (time t2). The driving signal Ck21 is turned on and, at the same time, the driving signal Ck12 is turned on. Then, the charges accumulated in the pixels PX3 and PX7 are respectively transferred to the floating diffusions 8 of the cells CE1 and CE2 and, at the same time, charges accumulated in the pixels PX1 and PX5 are respectively transferred to the pixels PX2 and PX6.

When the charges accumulated in the pixels PX3 and PX7 are read out, the reset signal RS is turned on. Then, the reset transistor M9 is turned on and the charges of the floating diffusions 8 of the cells CE1 and CE2 are reset.

When the charges accumulated in the pixels PX3 and PX7 are read out, the driving signal Ck11 is turned on. Then, the charges respectively transferred from the pixels PX1 and PX5 to the pixels PX2 and PX6 are respectively transferred to the floating diffusions 8 of the cells CE1 and CE2 and respectively read out as the signals Vsig2 and Vsig1 (time t3). The driving signal Ck11 is turned on and, at the same time, the driving signal Ck22 is turned on. Then, the charges accumulated in the pixels PX1 and PX5 are respectively transferred to the floating diffusions 8 of the cells CE1 and CE2 and, at the same time, charges accumulated in the pixels PX4 and PX8 are respectively transferred to the pixels PX3 and PX7.

When the charges accumulated in the pixels PX1 and PX5 are read out, the reset signal RS is turned on. Then, the reset transistor M9 is turned on and the charges of the floating diffusions 8 of the cells CE1 and CE2 are reset.

When the charges accumulated in the pixels PX1 and PX5 are read out, the driving signal Ck21 is turned on. Then, the charges respectively transferred from the pixels PX4 and PX8 to the pixels PX3 and PX7 are respectively transferred to the floating diffusions 8 of the cells CE1 and CE2 and respectively read out as the signals Vsig2 and Vsig1 (time t4).

Figure 7:
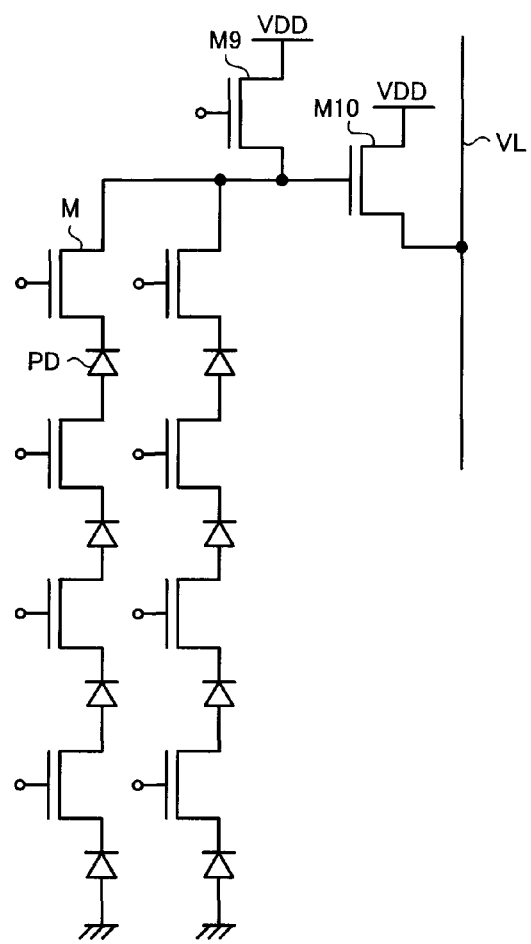
FIG. 7 is a diagram of an equivalent circuit for eight pixels and one cell of a solid-state imaging device according to a second embodiment of the present invention.

FIG. 7 is a diagram of an equivalent circuit for eight pixels and one cell of a solid-state imaging device according to a second embodiment of the present invention.

In FIG. 7, four charge coupled devices M, to which photodiodes PD are connected, are connected in series and two circuits of the charge coupled devices M connected in series are connected in parallel, whereby an eight-pixel one-cell structure is formed. The eight pixels are arranged side by side in the vertical direction. A floating diffusion of this cell is arranged between a fourth pixel and a fifth pixel.

Charges of the fourth pixel, the fifth pixel, a third pixel, a sixth pixel, a second pixel, a seventh pixel, a first pixel, and an eighth pixel are transferred to the floating diffusion in this order.

When the charges of the fifth pixel are transferred to the floating diffusion, the charges of the seventh pixel are transferred to the sixth pixel, the charges of the first pixel are transferred to the second pixel, and the charges of the third pixel are transferred to the fourth pixel.

When the charges of the third pixel are transferred to the floating diffusion, the charges of the first pixel are transferred to the third pixel, the charges of the seventh pixel are transferred to the fifth pixel, and the charges of the eighth pixel are transferred to the seventh pixel.

In the embodiments explained above, it is also possible to connect N charge coupled devices in series and connect, in parallel, two circuits of the charge coupled devices connected in series to form one pixel from 2N pixels. N is an integer equal to or larger than 2. In this case, the 2N pixels can be arranged side by side in the vertical direction and a floating diffusion can be arranged between an Nth pixel and an N+1th pixel.

In this case, charges of the Nth pixel, the N+1th pixel, an N−1th pixel, an N+2th pixel, an N−2th pixel, an N+3th pixel, . . . , a first pixel, and an 2Nth pixel are transferred to the floating diffusion in this order. When the charges of the N+1th pixel are transferred to the floating diffusion, the charges of an N−(A−1)th (A is an even number) pixel are transferred to an N−Ath pixel and the charges of an N+(A+1)th pixel are transferred to an N+Ath pixel.

In the embodiment, a back-illuminated cell is explained as an example. However, the present invention is not limited to the back-illuminated cell and can also be applied to a front-illuminated cell.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
   a cell including 2N pixels configured to accumulate charges generated based on incident light;
   an amplifier transistor formed for the cell and configured to amplify, for each of the pixels, signals read out from the pixels to a floating diffusion;
   charge coupled devices configured to transfer the charges accumulated in the pixels to the floating diffusion;
   horizontal driving lines configured to drive the charge coupled devices; and a vertical signal line configured to transmit the signals amplified by the amplifier transistor, wherein
   the 2N pixels are arranged side by side in a vertical direction, and
   the floating diffusion is arranged between an Nth pixel and an N+1th pixel, and wherein
   charges of the Nth pixel, the N+1th pixel, an N−1th pixel, an N+2th pixel, an N−2th pixel, an N+3th pixel, . . . , a first pixel, and an 2Nth pixel are transferred to the floating diffusion in this order, and
   when the charges of the N+1th pixel are transferred to the floating diffusion, the charges of an N−(A-1)th (A is an even number) pixel are transferred to an N−Ath pixel and the charges of an N+(A+1)th pixel are transferred to an N+Ath pixel.

2. The solid-state imaging device according to claim 1, wherein the
cell is a back-illuminated cell.

3. The solid-state imaging device according to claim 1, further comprising a reset transistor provided for each of a pair of cells adjacent to each other and configured to reset the charges accumulated in the pixels.

4. A solid-state imaging device comprising:
   a cell including four pixels configured to accumulate charges generated based on incident light;
   an amplifier transistor formed for the cell and configured to amplify, for each of the pixels, signals read out from the pixels to a floating diffusion;
   charge coupled devices configured to transfer the charges accumulated in the pixels to the floating diffusion;
   horizontal driving lines configured to drive the charge coupled devices; and
   a vertical signal line configured to transmit the signals amplified by the amplifier transistor, wherein
   the four pixels are arranged side by side in a vertical direction, and
   the floating diffusion is arranged between a second pixel and a third pixel, and wherein
   charges of the second pixel, the third pixel, a first pixel, and a fourth pixel are transferred to the floating diffusion in this order, and
   when the charges of the third pixel are transferred to the floating diffusion, the charges of the first pixel are transferred to the second pixel and, when the charges of the first pixel are transferred to the floating diffusion, the charges of the fourth pixel are transferred to the third pixel.

5. The solid-state imaging device according to claim 4, wherein the charge coupled devices include:
   a first charge transfer electrode provided in the first pixel;
   a second charge transfer electrode provided in the second pixel;
   a third charge transfer electrode provided in the third pixel; and
   a fourth charge transfer electrode provided in the fourth pixel.

6. The solid-state imaging device according to claim 5, wherein the horizontal driving lines include:
   a first horizontal driving line connected to the first charge transfer electrode;
   a second horizontal driving line connected to the second charge transfer electrode;
   a third horizontal driving line connected to the third charge transfer electrode; and
   a fourth horizontal driving line connected to the fourth charge transfer electrode.

7. The solid-state imaging device according to claim 6, wherein the vertical signal line is arranged on the first charge transfer electrode, the second charge transfer electrode, the third charge transfer electrode, and the fourth charge transfer electrode.

8. The solid-state imaging device according to claim 7, further comprising a power supply line provided in parallel to the vertical signal line.

9. The solid-state imaging device according to claim 4, further comprising a reset transistor provided for each of a pair of cells adjacent to each other and configured to reset the charges accumulated in the pixels.

10. The solid-state imaging device according to claim 9, wherein an amplifier transistor of a first cell, an amplifier transistor of a second cell, a floating diffusion of the first cell, and a floating diffusion of the second cell are respectively arranged on front and back and left and right of the reset transistor.

11. The solid-state imaging device according to claim 10, wherein
   the amplifier transistor of the first cell is arranged adjacent to the front of the reset transistor, and
   the amplifier transistor of the second cell is arranged adjacent to the back of the reset transistor.

12. The solid-state imaging device according to claim 11, wherein the reset transistor, the amplifier transistor of the first cell, and the amplifier transistor of the second cell are arranged between the first cell and the second cell.

13. The solid-state imaging device according to claim 12, wherein
   the floating diffusion of the first cell is arranged adjacent to the left of the reset transistor, and
   the floating diffusion of the second cell is arranged adjacent to the right of the reset transistor.

14. The solid-state imaging device according to claim 13, wherein pixel isolation diffusion layers configured to isolate each of the pixels are formed among the pixels.

15. The solid-state imaging device according to claim 4, wherein the cell is a back-illuminated cell.

16. The solid-state imaging device according to claim 4, wherein diffusion layers configured to form potential gradient in a direction of the floating diffusion are provided on the charge coupled devices.

\* \* \* \* \*